United States Patent [19]

Fredrickson

[11] Patent Number: 5,705,932
[45] Date of Patent: Jan. 6, 1998

[54] SYSTEM FOR EXPANDING SPACE PROVIDED BY TEST COMPUTER TO TEST MULTIPLE INTEGRATED CIRCUITS SIMULTANEOUSLY

[75] Inventor: Toby Alan Fredrickson, San Jose, Calif.

[73] Assignee: Xilinx, Inc., San Jose, Calif.

[21] Appl. No.: 541,567

[22] Filed: Oct. 10, 1995

[51] Int. Cl.$^6$ ............................................. G01R 31/02
[52] U.S. Cl. ................................... 324/754; 324/755
[58] Field of Search ............................ 324/754, 761, 324/758, 755, 73.1, 72.5, 158.1; 439/482, 86, 66, 67

[56] References Cited

U.S. PATENT DOCUMENTS

| | | | |
|---|---|---|---|
| 4,928,061 | 5/1990 | Dampier et al | 324/754 |
| 4,975,638 | 12/1990 | Evans et al. | 324/72.5 |
| 5,101,149 | 3/1992 | Adams et al. | 324/73.1 |
| 5,148,103 | 9/1992 | Pasiecznik, Jr. | 324/758 |
| 5,489,852 | 2/1996 | Gomez | 324/754 |

*Primary Examiner*—Vinh P. Nguyen
*Attorney, Agent, or Firm*—Edel M. Young; Thomas S. MacDonald

[57] ABSTRACT

A semiconductor device tester and handler interface includes a tester mother board and a handler board. The handler board includes a central area adapted to mount multiple semiconductor devices to be tested by a tester. The tester mother board has a central area, and first and second peripheral groupings of tester contacts fixed in location on the tester mother board. A ring of spaced electrical connectors such as compressible pogo pins on the tester mother board is positioned between the first and the second groupings of tester contacts such that the area of the handler boards available for mounting semiconductor devices is enhanced. This larger area permits testing in parallel of a plurality of semiconductor devices. A non-electrically conductive coplanarity plate is positioned between the tester and handler boards and forms a cavity inboard of the pogo pins for providing a stand-off to allow pogo pin compressions within a fixed range, to provide equal compression of all the pogo pins, to prevent bending or buckling of the boards, and allows dry gas to be flowed against the back side of the handler board during cold temperature testing.

13 Claims, 16 Drawing Sheets

SYSTEM FOR EXPANDING SPACE PROVIDED BY TEST COMPUTER TO TEST MULTIPLE INTEGRATED CIRCUITS SIMULTANEOUSLY

FIELD OF THE INVENTION

The present invention relates to integrated circuit semiconductor device test apparatus, more particularly to a tester and handler interface that ensures equal compression of compressible test pins and provides for multiple site testing.

DESCRIPTION OF THE RELATED ART

Semiconductor device testing apparatus or systems typically include a tester, which is an expensive piece of computing equipment for generating and receiving test signals, a chip handler, which is an expensive precise robot for moving semiconductive devices from one location to another under control of software, and a docking assembly for aligning and electrically connecting a tester mother board attached to the tester to a handler board attached to the chip handler. Typically, the tester mother board includes a plurality of compressible pins which must be accurately positioned to mate with contact pads or pin openings on the handler board. Sometimes the tester mother board and the handler board are combined, in which case the chip handler inserts semiconductive devices into the single board attached to the tester.

FIG. 1 shows the top view of a segment of a prior art standard automated test equipment (ATE) tester mother board 10. Mother board 10 includes an inner ring 11 and an outer ring 12 of spaced tester contacts. The rings 11 and 12 of tester contacts include groups of contacts such as groups 11a and 12a. Each group extends through the board to a male plug on the bottom surface of tester mother board 18, which is connected to pins of a tester. The tester pins receive signals from a computer. The tester mother board carries signals from the tester mother board to the handler board, and the handler board in turn carries the signals to a device under test. Output signals from the device under test are returned to the tester by a similar path. Tester contact groups 11a and 12a are repeated radially around the two concentric rings of tester contacts. Each group extends through mother board 10 to form an electrical contact in a plug extending downward from the bottom surface of mother board 10. These plugs must mate with pins in the tester. Ring 11 is spaced radially from ring 12 by a distance D, which must match with a corresponding distance in the tester and thus may not be varied. Concentric rings 14 and 15 of compressible pins 14a and 15a such as pogo pins are provided radially inward of rings 11 and 12 of tester contacts 11a and 12a. Each of the pogo pins 14a and 15a is connected to an individual signal line in the tester. A third ring 16 of pogo pins 16a are connected to the utility connections of the tester such as the tester's power supplies, relay controls, external +5 volt relay power supply, ground, and board statistics register. (A board statistics register contains information about the board such as its serial number, repair record, model number, and date of manufacture, and can be used by software to verify that the board is acceptable for the current use.) Threaded apertures 17 spaced around the tester mother board allow for connection to a handler board and for alignment of the two boards.

FIG. 2 is a schematic cross-sectional view of tester mother board 10 which shows schematically the groups of tester contacts 11 and 12, the rings 14 and 15 of pogo pins and the ring 16 of pogo pins. Individual pogo pins 14a 15a, 16a and 16b are also seen.

FIG. 3a illustrates the top surface 209 of a handler board 20 showing via connections 21 to selected pogo pins on the ring 16 of the mating tester mother board 10, metallization traces 22a from contact pads such as 20a to via connections 21, traces 22b from via connections 21 to contact areas 23 adjacent to a test position 24 into which the semiconductor device will be inserted, mounted, and tested. FIG. 3a also shows a trace 22c extending from a contact pad 20a to a contact area 23. Bolts inserted through apertures 26 align handler board 20 with tester mother board 10 of FIG. 1 and hold the two boards together.

FIG. 3b is a bottom view of the handler board of FIG. 3a showing contact pads 27 which are contacted by corresponding pogo pins 16a of ring 16 and showing the test site 24 for insertion of the semiconductor device under test. FIG. 3b also shows two rings of contact pads 28 and 29 which will be contacted by the pogo pins 14a and 14b of the two rings 14 and 15 of pogo pins, and shows alignment apertures 26. Typically, the screws that go through these holes are shoulder bolts to prevent loss during disassembly.

FIG. 4 shows another prior art mother board 30. Mother board 30 includes a test site 38 for inserting semiconductor devices and thus does not require a separate handler board. In FIG. 4, tester contacts 31 are arranged in groups which extend radially toward the center of mother board 30. A single test site 38 is positioned in the center of mother board 30 for receiving semiconductor devices for testing. The particular test site shown includes 48 sockets 39 for receiving 48 pins of a semiconductor device. Metallization traces connect the tester contacts to the sockets, one metallization trace for connecting each socket to a contact. For example, metallization trace 36a connects contact 31a to socket 39a. In FIG. 4, 24 of the metallization traces are shown. Additionally, 24 more traces are formed in interior layers of mother board 30. Mother board 30 includes many more than 48 contacts 31. One mother board manufactured by Micro Ceramics, Inc. of Los Gatos, Calif., similar to mother board 30 includes 1152 contacts for interfacing with the SC212 tester from Credence Systems Corporation. Of these 1152 contacts, about half are connected to a ground plane in the board. Ground planes separate layers of metallization from each other. Some contacts are connected to two layers of power planes. Some are also connected to board statistics registers. About 300 contacts are available for carrying signals to a test site. But the space for test sites in such a mother board is limited to about 25% of the board area, and if the metallization traces are all to have equal delay, it is not possible to lay out 300 metallization traces in the area provided or to provide multiple test sites in the small area. Thus a board such as mother board 30 can not take full advantage of the tester with which it must interface.

FIG. 5 illustrates the interface of the tester mother board of FIG. 1 to an automated handler board or card 20 where the radial interior or central area of the ring 16 of pogo pins 16a and 16b (two pins shown) delineates a relatively small diameter working area $W_1$, in which a semiconductor device 25 can be mounted. This area, which is about 80–120 square centimeters in a typical handler board is so restricted in size that only a single semiconductor device 25 can be accommodated at one time on the handler board 20. Indeed, the area available for the device to be tested plus the metallization lines leading to the device may be less than 6% of the total area occupied by this prior art tester interface structure. Further, as can be seen in FIG. 1, the radial distance between the innermost ring 16 of pogo pins in tester mother board 10 and the group of tester contacts 12 is relatively long, actually about 12–15 cm in a typically utilized Credence, Inc. No.

8256 tester mother board. The prior art placement of the pogo pin rings 14, 15 and 16 radially inwardly of the groups 11 and 12 of tester contacts also limits the number of spaced pogo pins which can be accommodated around rings 14, 15, and 16 since the ring diameters are relatively small e.g., 12 cm for ring 16 in a Credence No. 8256 tester mother board. The above prior art configuration was designed to have the rings of pogo pins 14, 15 and 16 as close as possible to the semiconductor device test position 24 so as to minimize the length of metallization lines from the contact areas 23 to the pogo pin rings 14, 15, 16, and hence minimize any signal loss. However, FIG. 5 illustrates the radially wide separation of inner ring 16 of pogo pins in tester mother board 10 and contact areas 23 in handler board 20 from the tester contacts 11 and 12 which send and receive the test signals.

A need has arisen to permit a tester/handler to test multiple semiconductor devices at the same time on the same tester/handler, while minimizing any signal loss, and without necessitating any change in the spacing and location of the groups of tester contacts in order to be compatible with standard ATE testers. There is also a need for a handler board which can apply a larger number of signals to a single semiconductor device. As the tester mother boards become larger to accommodate higher and higher pin counts, a need has also arisen to ensure equal compression of all the pins on the tester mother board and to minimize any bending or buckling of the board. There is also a need to accommodate testing semiconductor devices at low temperatures.

SUMMARY OF THE INVENTION

In accordance with the present invention, a tester and handler interface is provided in which the tester mother board includes at least one ring of spaced electrical connectors positioned between the first and second groups of tester contacts on the tester mother board.

This permits the rings of pogo pins to be closer to the tester contacts, minimizing the length of connecting metallization lines, providing a greater number of pogo pins due to the increased diameter of the rings of pogo pins and, importantly, greatly increasing the work area of the handler board. The handler board can include multiple sites for mounting and testing semiconductor devices. This in turn increases throughput of tested semiconductor devices without the purchase, set-up and use expense of additional testers, without additional facility/space for additional testers and handlers.

In one embodiment of the invention, one ring of pogo pins connects to tester channels and another ring of pogo pins connects to the tester's utilities such as power supplies, relay controls, external +5 volt relay power supply and board star register. The two larger rings of the invention can take the place of three or four rings used in prior art interfaces.

In another embodiment, a non-electrically conductive coplanarity plate shaped as a ring extends between the handler and tester boards. The coplanarity ring has an inner periphery bounding the central working area of the handler board and an outer periphery adjacent to the inner ring of pogo pins. The coplanarity ring functions to equalize the compression of the spring-biased pogo pins and prevents bending or buckling of the two boards without overstressing the spring-biased pogo pins. This coplanarity ring also assists in assuring a coplanar alignment between the tester and the automated semiconductor device handler which inserts semiconductor devices into the handler board.

During low temperature testing, the low temperature of the devices under test can cause condensation to form on parts of the handler board near the chips. This condensation can cause shorting between physically close metallization lines in the vicinity of the chips, particularly on the back side of the handler away from the chips, which may be in an environment different from the chips. To avoid moisture condensation during reduced temperature testing, the coplanarity ring may nearly seal the space between the tester and handler boards and thus form the wall of a container for dry gas, and may have radial or other grooves to allow venting of external dry gas pumped into the space between the tester and handler boards during such testing.

In yet another aspect, guide pins are provided on the tester mother board onto which both the handler board and the coplanarity ring are passed to align the interface and insure against improper mounting.

Particularly, a semiconductor device tester/handler interface is provided including a tester mother board and a handler board; the handler board including a central area adapted to mount at least one semiconductor device to be tested by a tester; the tester mother board having a central area, an inner grouping of tester contacts and an outer grouping of tester contacts spaced to cooperate with a tester; at least one expanse of spaced electrical connectors positioned between the two groups of tester contacts such that the central area of the handler is larger than the central area of the tester mother board. In one embodiment, this larger central area permits testing of a plurality of semiconductor devices.

BRIEF DESCRIPTION OF THE DRAWINGS

FIG. 14b is a coplanarity ring used with the tester mother board of FIG. 14a.

FIG. 14c is a bottom view of a handler board used with the tester mother board of FIG. 14a.

DETAILED DESCRIPTION

Figure 1:
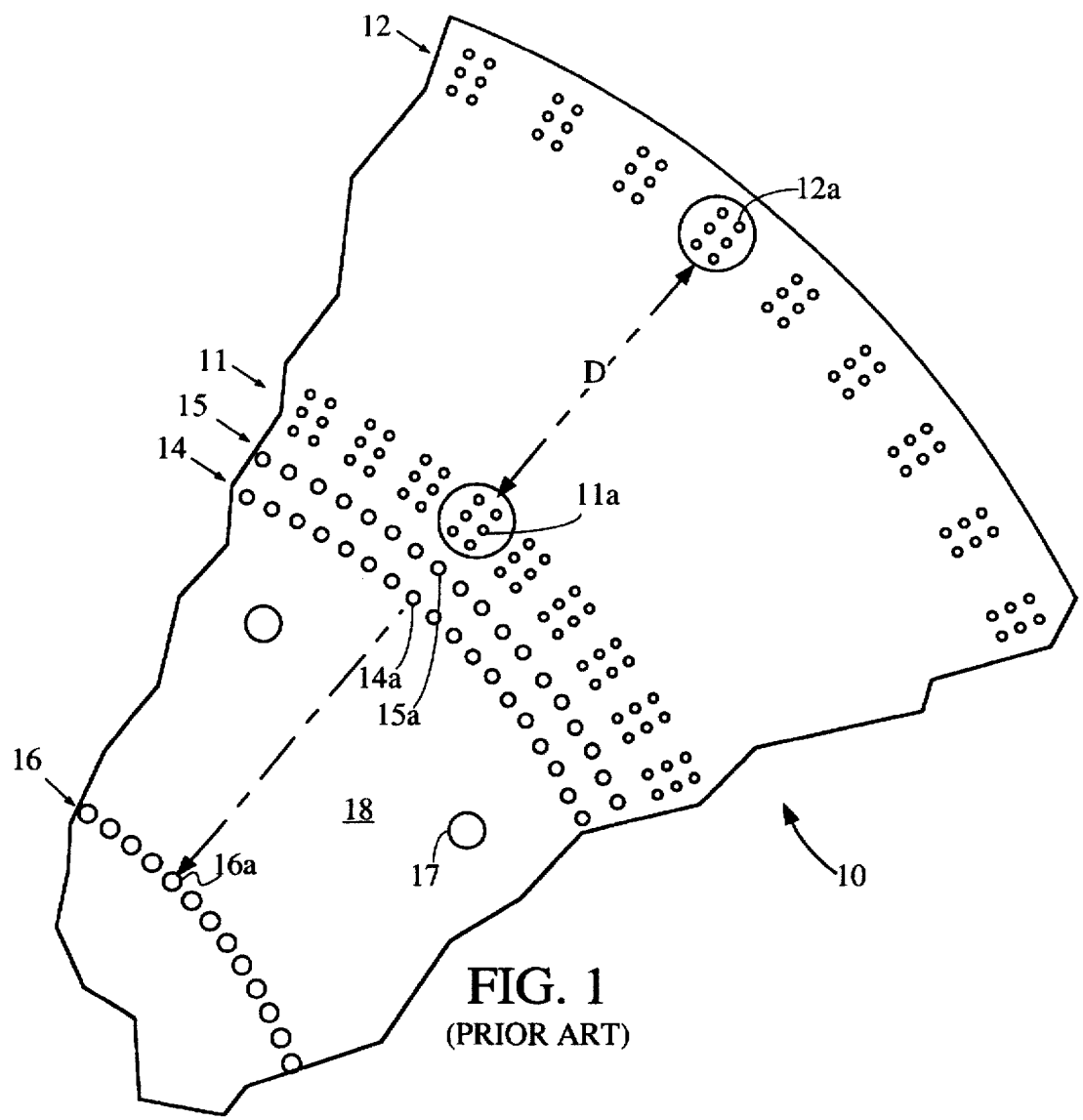
FIG. 1 is a top view of a segment of a prior art tester mother board.
Figure 2:
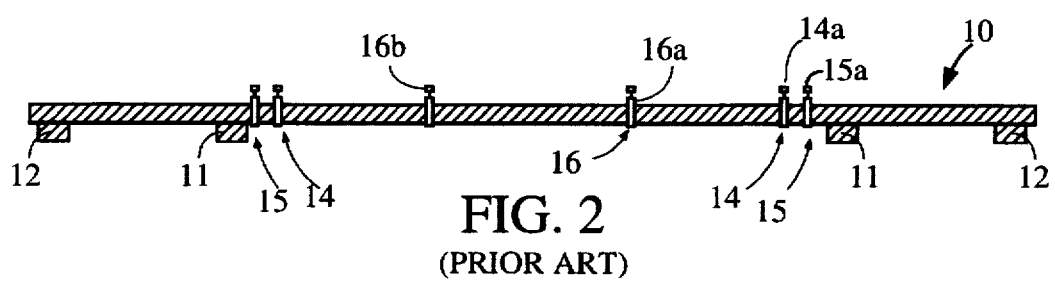
FIG. 2 is a schematic side view of the prior art tester mother board of FIG. 1.
Figure 3A:
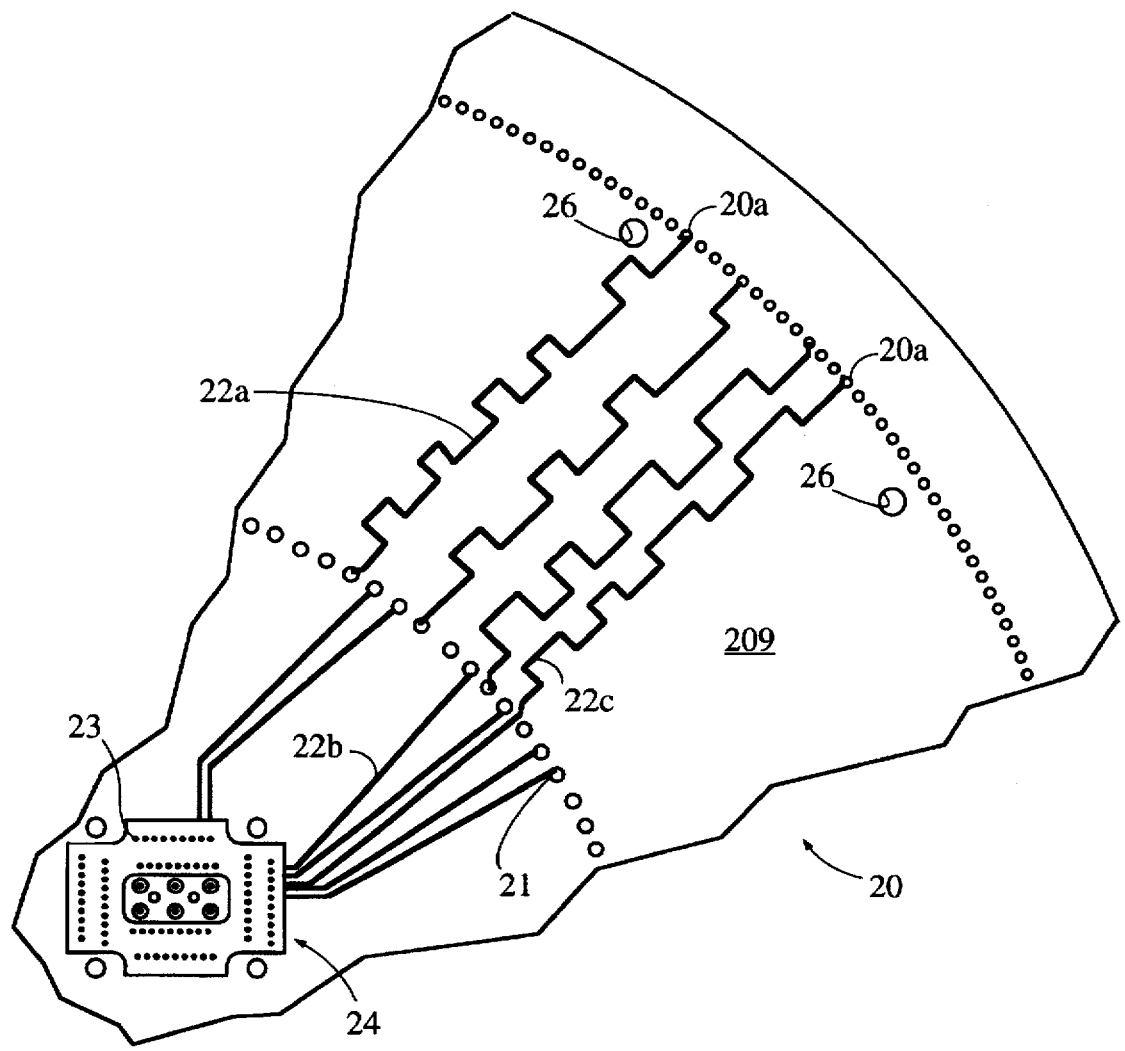
FIG. 3a is a top view of a segment of a prior art handler board.
Figure 3B:
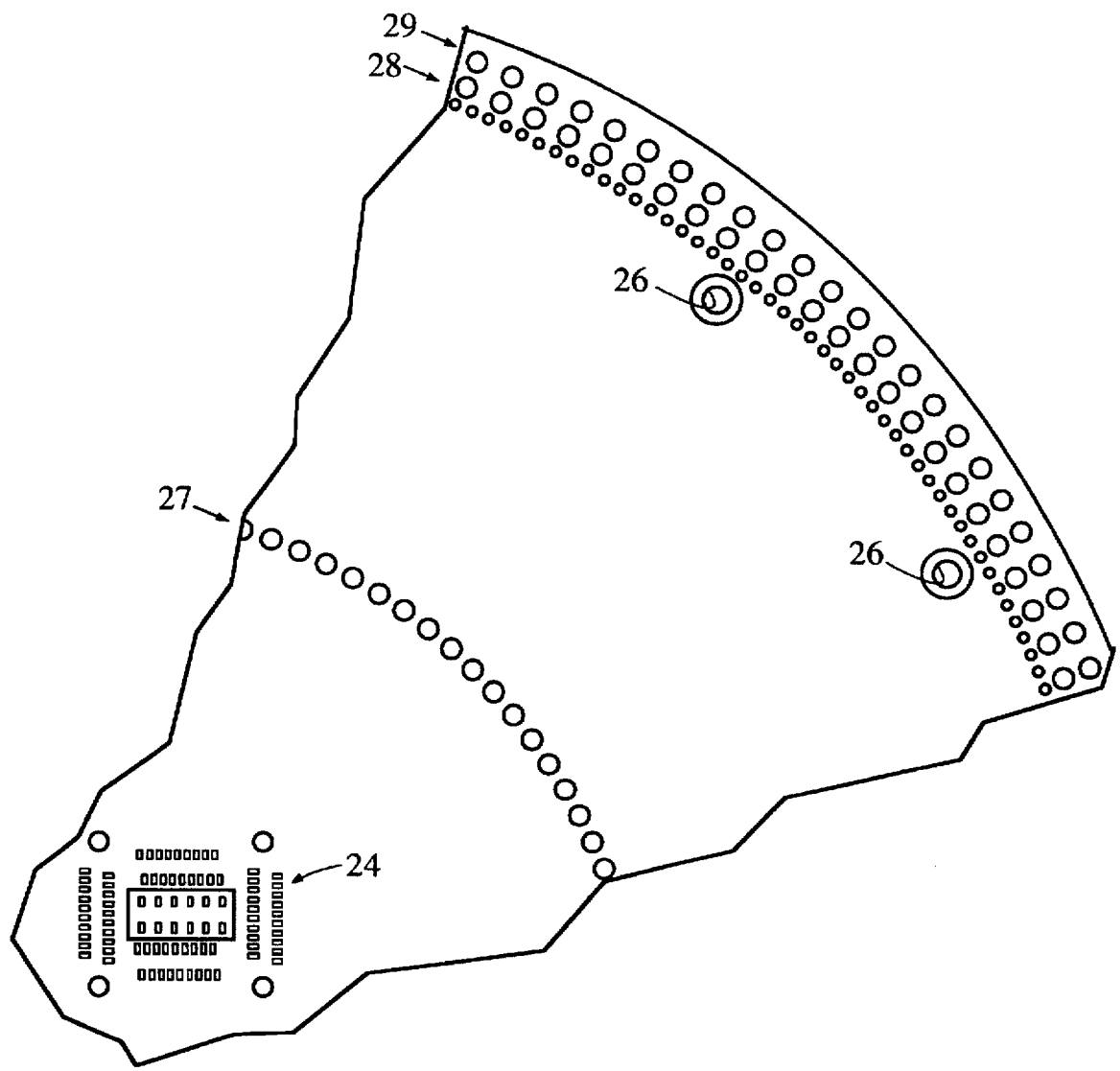
FIG. 3b is a bottom view thereof.
Figure 4:
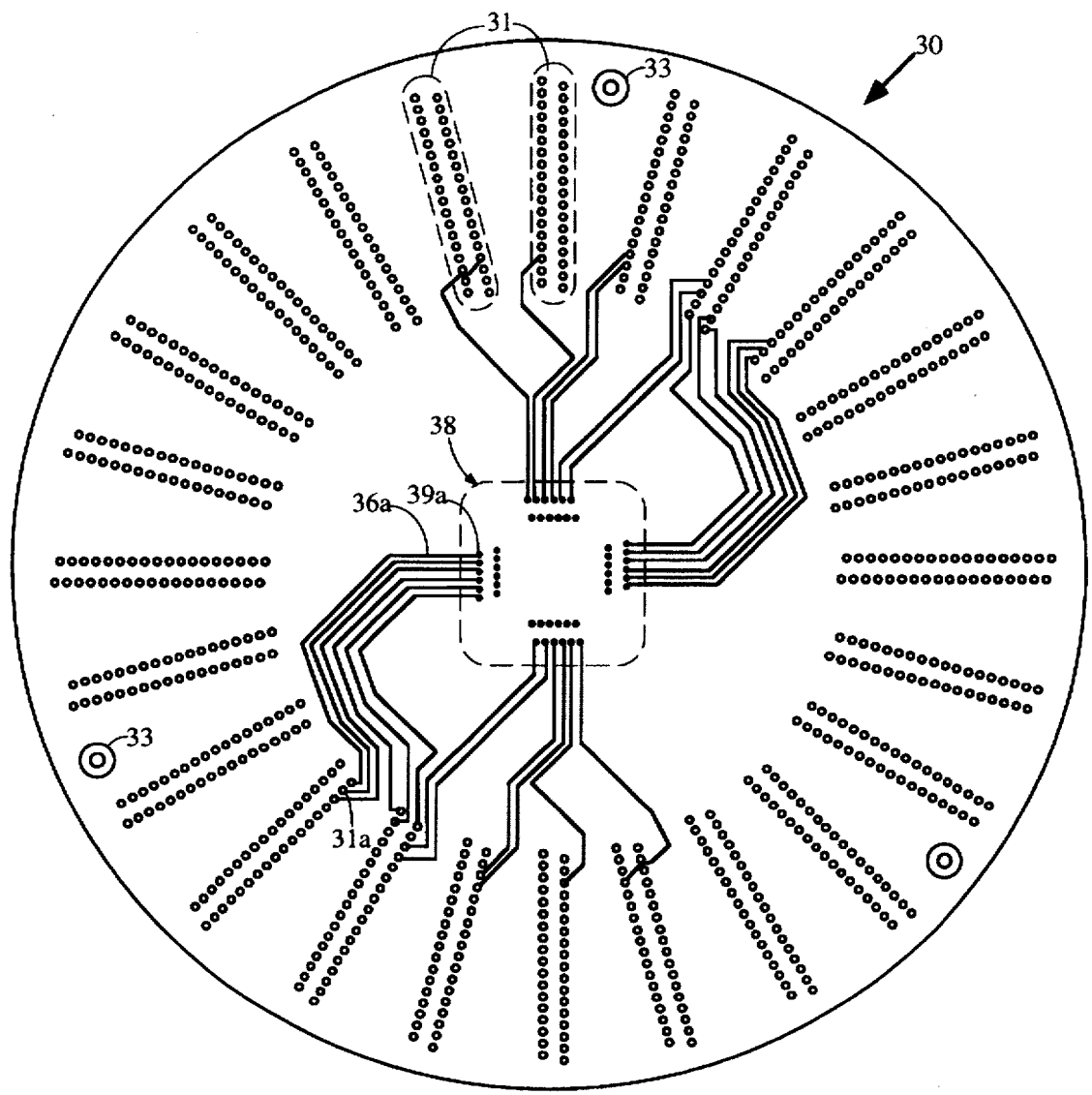
FIG. 4 is a prior art board which interfaces with both a tester and a handler.
Figure 5:
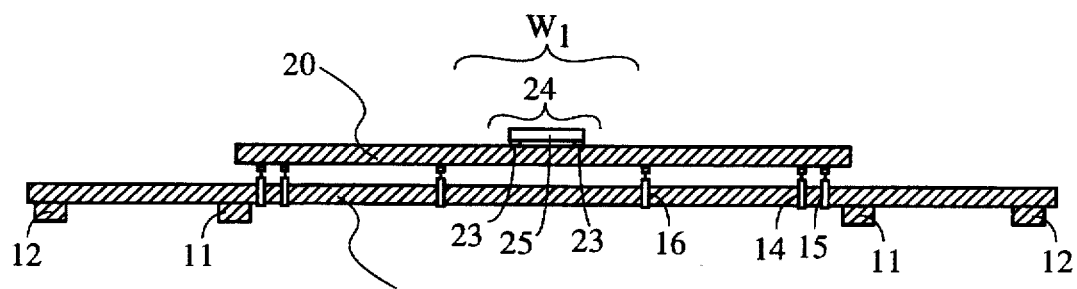
FIG. 5 is a schematic side view of a prior art interface including the mother board of FIG. 1 and handler board of FIGS. 3 and 4.
Figure 6:
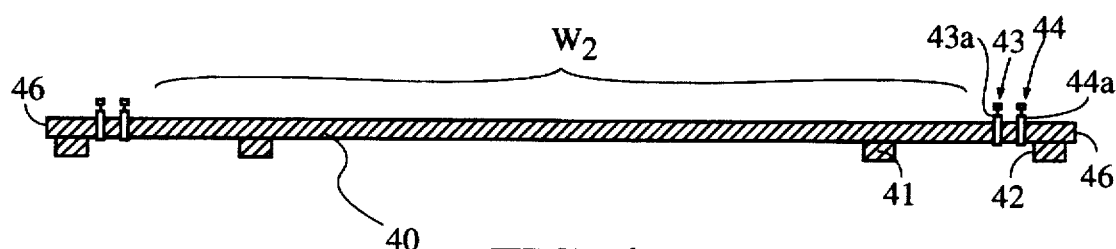
FIG. 6 is a schematic side view of a tester mother board of the invention.

FIG. 6 illustrates one embodiment of the tester mother board 40 of the invention. Tester contacts 41 and 42 have the same spacing and radial position as the two groups of tester contacts 11 and 12 in FIG. 1, so as to be compatible with standard automated test equipment. In contrast to the prior art, two rings 43 and 44 of spaced electrical connectors such as pogo pins 43a and 44a are positioned toward the outer periphery 46 of the tester mother board. Preferably, the rings of pins are positioned between the groups of tester contacts 41 and 42. A central area $W_2$ is formed which in one embodiment has an overall area of about 1000–1400 $cm^2$, which is about 10 times the area of the prior art central area $W_1$. By making the rings of electrical spring-biased pogo pins or connectors of larger diameter, the test interface can be made electrically smaller, i.e. shorter spans of metallization result when the semiconductor devices are placed physically closer to the metallization lines which carry test signals to and from their respective semiconductor devices.

Figure 7:
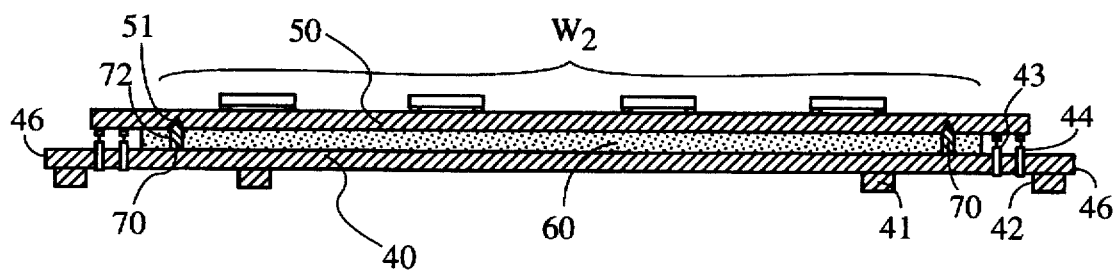
FIG. 7 is a schematic side view of the interface formed by mating of the tester mother board and handler board of the invention.

FIG. 7 shows the enhanced working area $W_2$ of the interface (the mother board and handler board combination) as well as a non-electrically conductive coplanarity plate 60 in the form of a ring. This ring may be formed of Delrin® plastic, having an outer diameter of about 39 cm, an inner diameter of about 28 cm, and a thickness of about 6 to 7 mm. The non-electrically conductive annular plate 60 is used to limit the compression of pogo pins 43a and 44a to a specified optimum range, such as 60% of the total travel, to assure that all the pogo pins are compressed equally and to assure that there is a coplanar relationship between the tester mother board 40 and the handler board 50.

Guide pins 70 are fixedly mounted on the tester mother board 40 between the rings of spaced tester contacts 41 and 42, and extend toward handler board 50. (Preferably, these guide pins comprise a sleeve threaded in its interior to receive a screw extending upward through mother board 40.) In assembly, matching apertures 51 in the handler board and apertures 72 in the coplanarity plate 60 are guided over guide pins 70, with the plate 60 acting as a stand-off and assuring a predetermined compression of the pogo pins to an optimum compression range for maximum electrical performance, eliminating pin damage due to overstress, and allowing an equal compression of each pogo pin. The addition of permanently mounted guide pins to the tester interface forces a precision alignment between the tester mother board and the device handler board.

Alignment in prior art devices is typically left to outside docking/alignment apparatus which may become misaligned or malfunctioning. Adding this alignment feature to the tester mother board allows for easier detection of errors in the external docking apparatus, docking without the need for external docking apparatus, and the provision for short term manual alignments for experimentation with untried pieces of equipment that may not be mechanically compatible.

Figure 8:
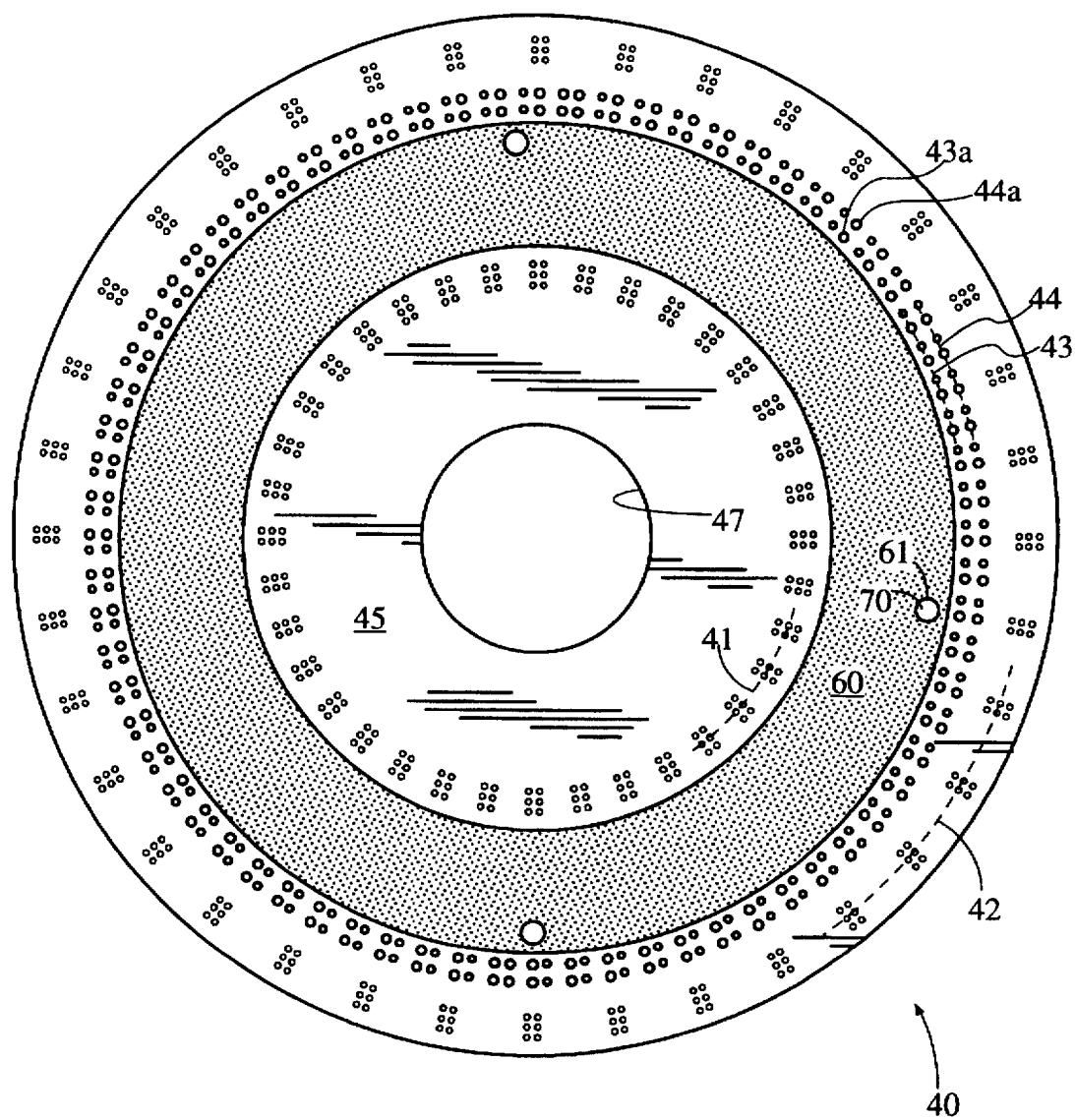
FIG. 8 is a top view of the tester mother board of the invention with a mounted complanarity plate.

FIG. 8 shows a top view of the circular tester mother board 40 with the two rings 43 and 44 of pogo pins near the board periphery. FIG. 8 also shows the inner ring of tester contacts 41 and the outer ring 42. A central aperture 47 in the board allows dry gas to be input for low temperature use. The non-conductive plate 60 extends concentrically between tester contacts 41 and pogo pin rings 43 and 44. Guide pins 70 extend through apertures 61 in plate 60. As shown in FIG. 7, the entire central area $W_2$ inboard of rings 43 and 44 of pogo pins is available for mounting multiple (e.g. 2 to 8) semiconductor devices on a handler board for simultaneous testing.

Figure 9:
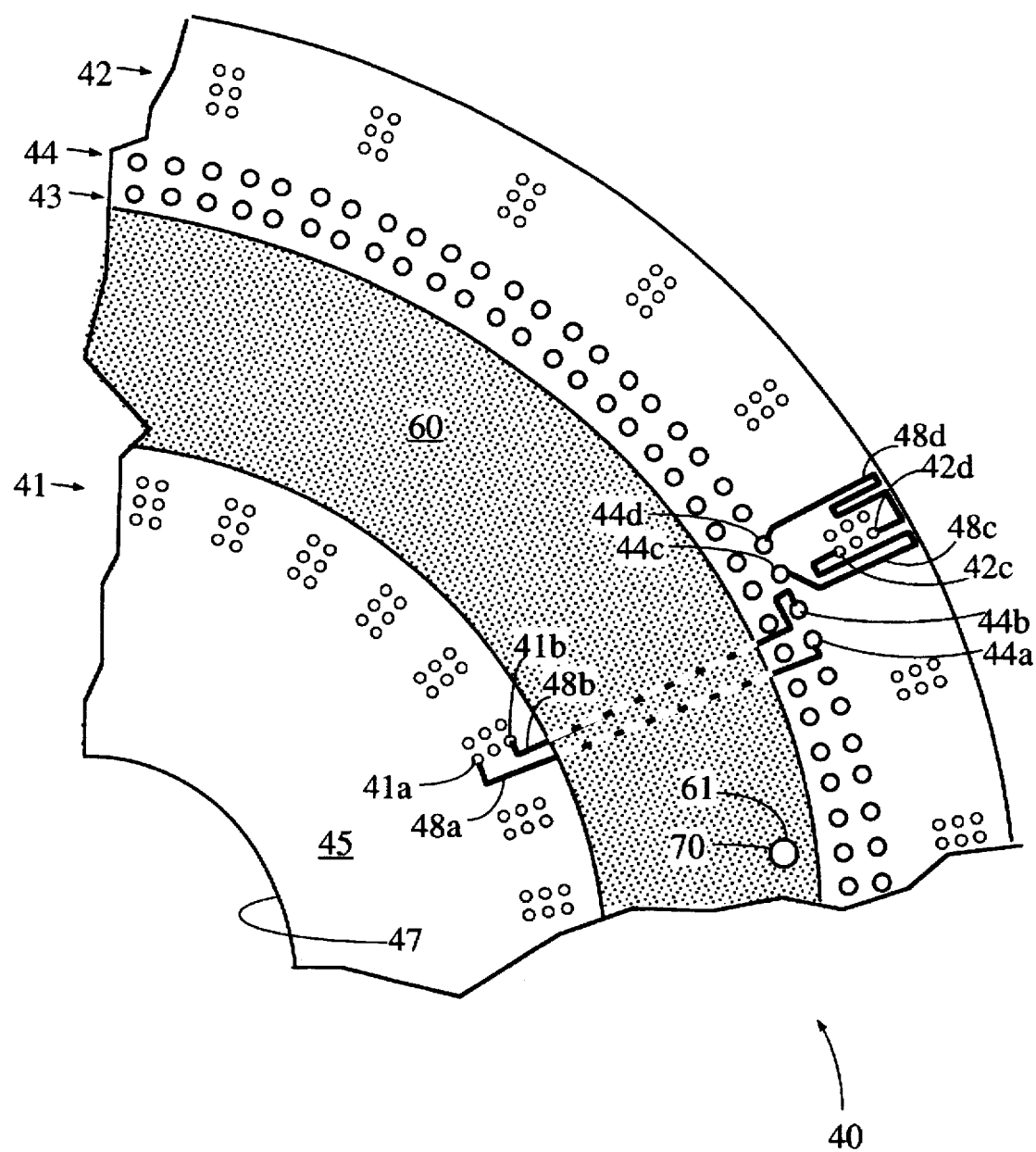
FIG. 9 is a schematic top view of a segment of the tester mother board of FIG. 8.

FIG. 9 is a more detailed view of a segment of FIG. 8. Pogo pins 44a and 44b are electrically connected to tester contacts 41a and 41b in inner ring 41 by metallization lines 48a and 48b respectively. Pogo pins 44c and 44d are connected to tester contacts 42c and 42d by metallization lines 48c and 48d respectively. Equivalent metallization lines not shown connect other pogo pins to other tester contacts.

Preferably, all metallization lines which connect a tester contact to a pogo pin are laid out to produce the same signal delay. In some embodiments, tester mother board 40 includes four layers of metallization lines, some of which are embedded in tester mother board 40. Because of impedance characteristics, metallization lines which are embedded in mother board 40 conduct signals more slowly than metallization lines on the surface of mother board 40. Therefore, for all metallization lines to have the same delay, interior metallization lines are made shorter than corresponding metallization lines on the surfaces of mother board 40. One can see by inspecting metallization lines 48a through 48d that detours have been added to lines 48c and 48d to give these lines the same delay as lines 48a and 48b. When all metallization lines have the same delay, input signals can be applied to the tester contacts by the tester and output signals detected by the tester without the need to delay some signals with respect to others to assure they arrive at the device under test at the proper time. The absolute delay of a metallization line is easily measured by the tester and subtracted from the test result to determine delays which are introduced by the device under test.

Figure 10:
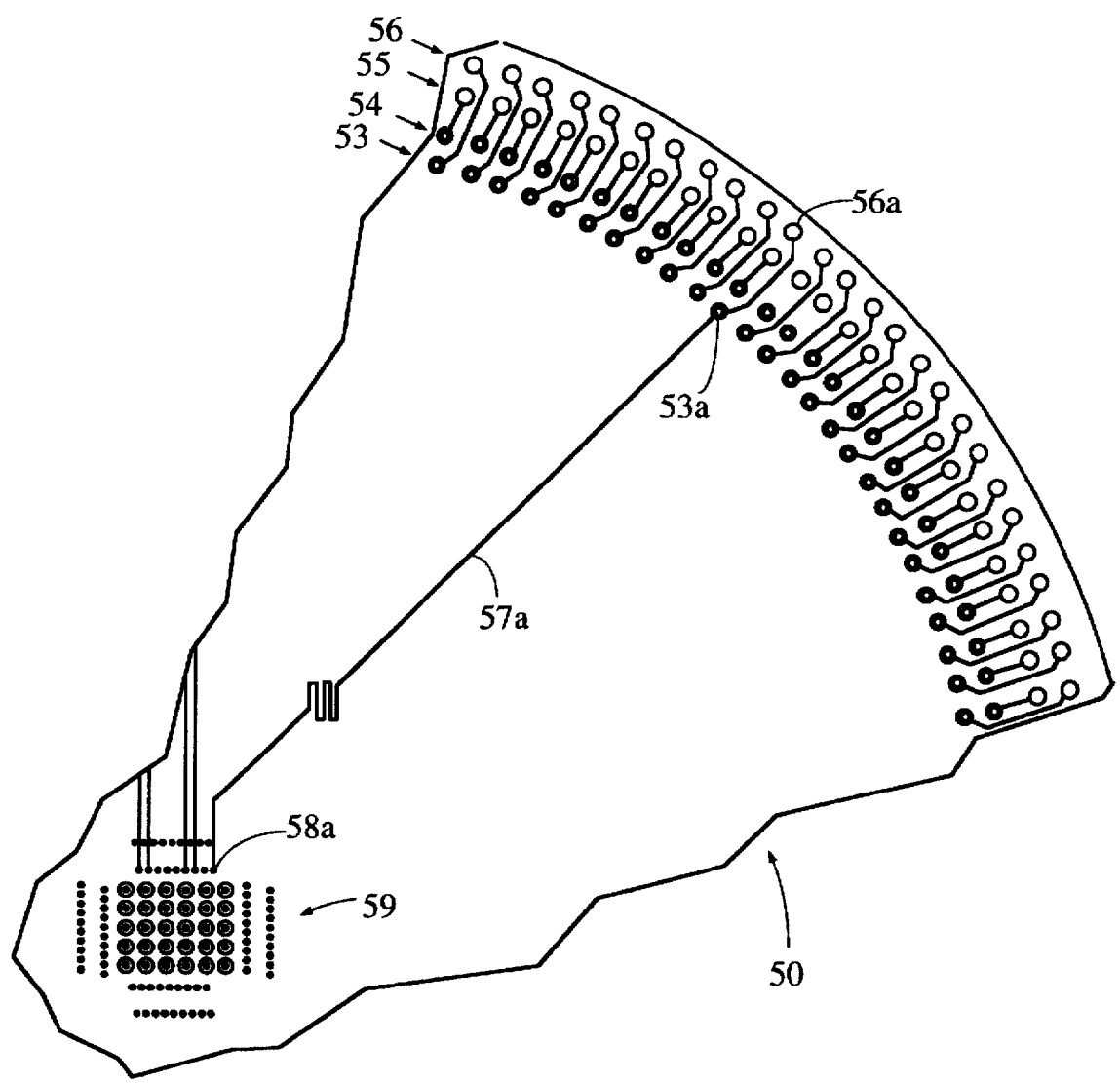
FIG. 10 is a schematic bottom view of a handler board of the invention.
Figure 11:
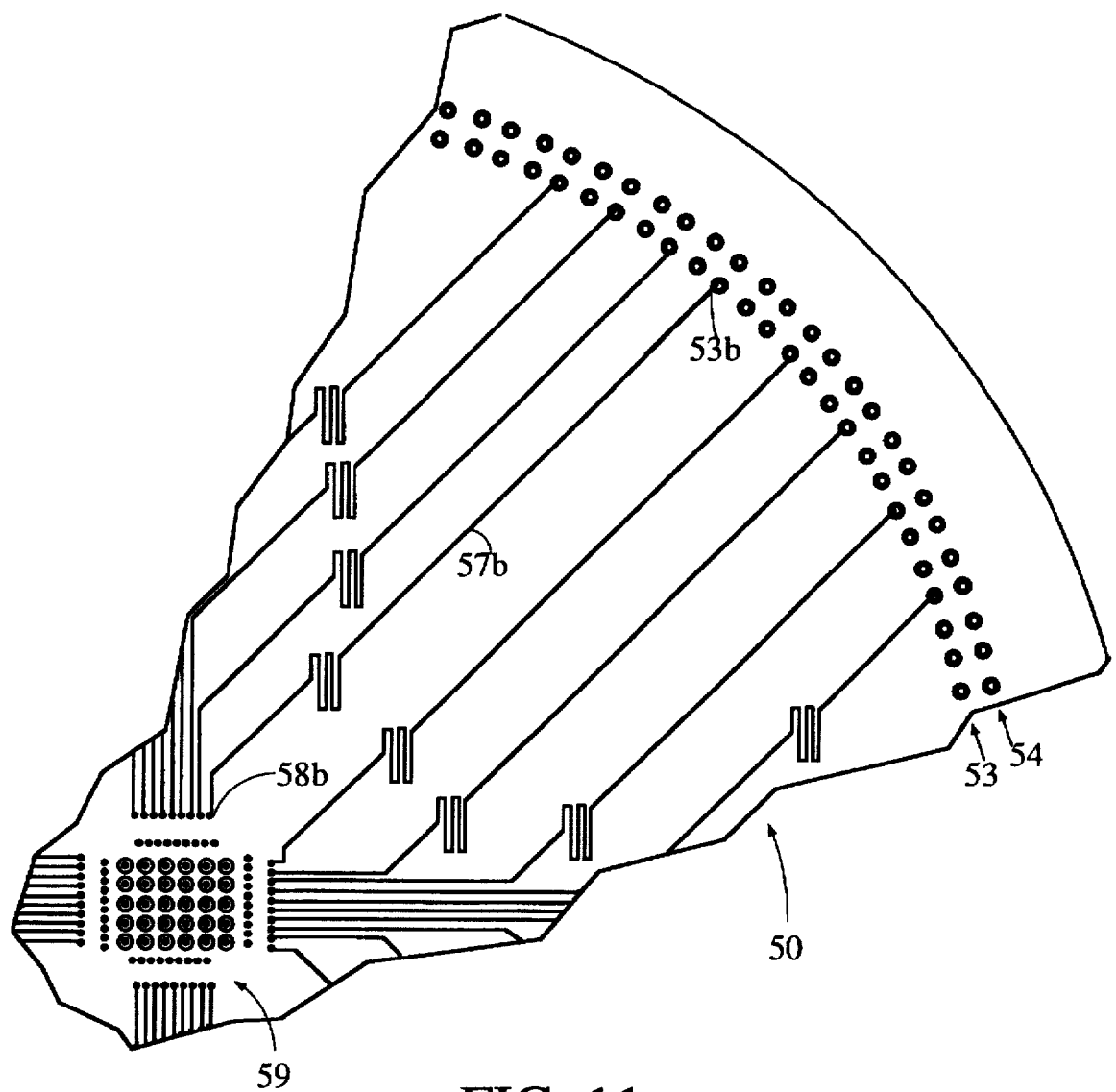
FIG. 11 is a top view thereof.

The metallization lines produce a signal delay which may be detrimental to obtaining proper measurement of signals in the device under test. As an advantage of the present invention, placing the pogo pin rings 43 and 44 between tester contact rings 41 and 42 and providing the large work area $W_2$ on the handler discussed in connection with FIG. 7 means that the total metallization distance from a tester contact to a pin on the device under test may be reduced and the timing accuracy delay correspondingly decreased so that the overall accuracy is increased. FIGS. 10 and 11 illustrate respective bottom and top surfaces of handler board 50. In FIG. 10, pogo pin contact pads in rings 55 and 56 are connected to vias in rings 53 and 54 which connect to metallization lines in one of the four layers of metallization in handler board 50. For example, contact pad 56a is connected to via 53a, which is connected by metallization line 57 to a socket 58 in test site 59. Additional metallization lines not shown connect other vias in rings 53 and 54 to other sockets in test site 59. As discussed above in connection with tester mother board 40, all metallization lines in handler board 50 provide the same signal delay from a contact in ring 55 or 56 to a socket in test site 59. Thus again no adjustment of individual signal timing must take place in order to assure that signals arrive at appropriate times to the device under test which is inserted into test site 59.

FIG. 11 shows part of the top surface of handler board 50. As shown in FIG. 11, via rings 53 and 54 are shown to extend from the bottom surface (FIG. 10) to the top surface (FIG. 11). Some vias in the via rings carry signals from the tester to the test site. For example, via 53b connects to metallization line 57b, which connects to contact 58b in test site 59, which is in turn connected to one of the sockets in the center of test site 59, into which a pin of a device under test is inserted. Each pin of the device under test is connected through appropriate sockets, vias, metallization, and contacts to a pin in the tester. For simplicity, not all connections are shown in the drawings.

The embodiment of FIGS. 8 through 11 includes only a single test site. Other embodiments include additional test sites, as discussed below.

Figure 12:
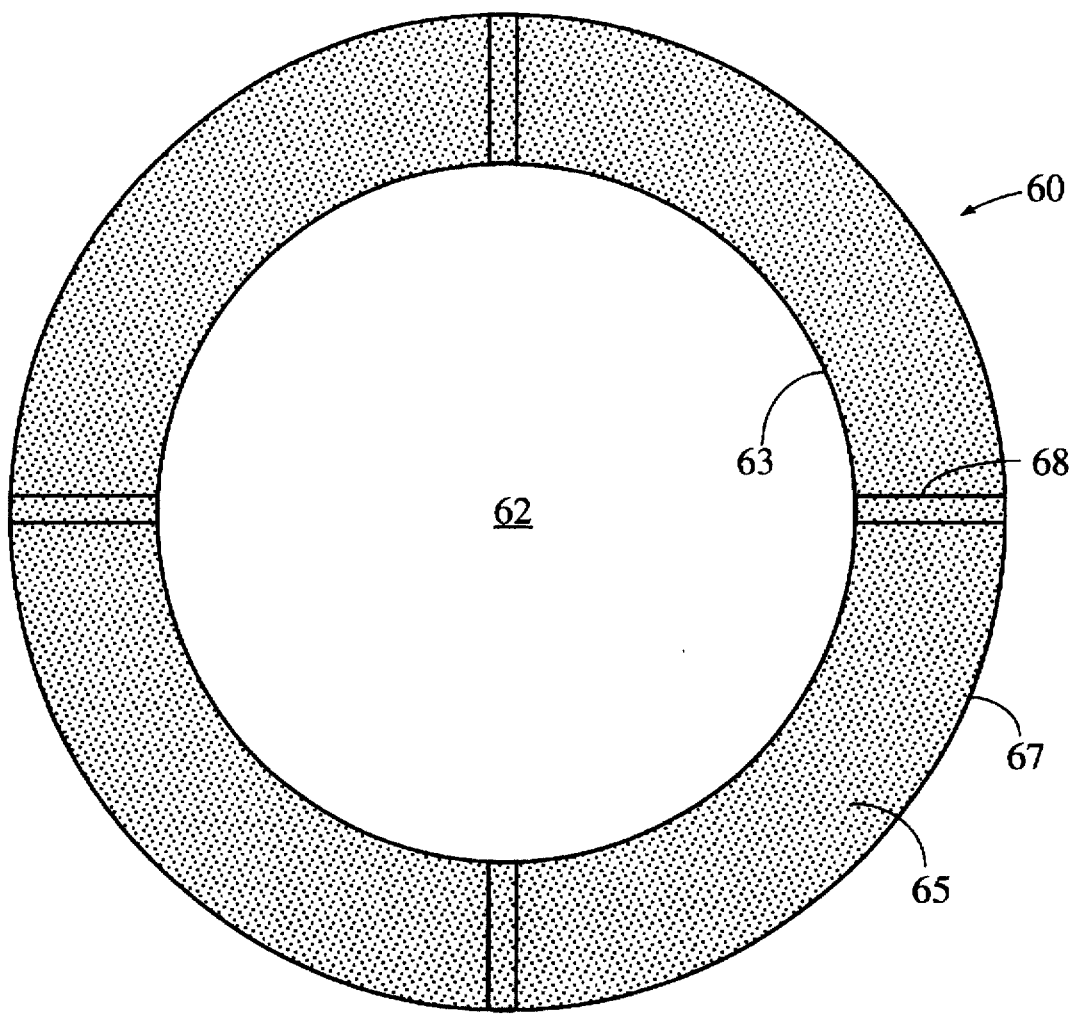
FIG. 12 is a bottom view of the coplanarity plate of the invention.
Figure 13:
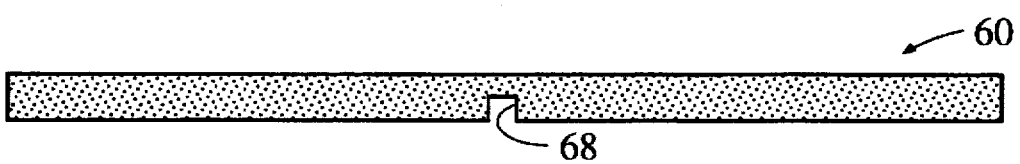
FIG. 13 is a side view thereof.

FIGS. 12 and 13 illustrates the bottom 65 of plate 60 with radial grooves 68 extending transversely of the plate from a central cutout 63 to a plate periphery 67. During reduced temperature e.g. 0° C. to −58° C. testing, moisture tends to condense and is undesirable. The side of the handler board into which devices are inserted may be in a cold dry environment and not subject to condensation. However, the back side of some prior art handler boards may be in contact with ambient atmosphere. The cold testing environment soon causes the back side of such a handler board to collect condensation from the atmosphere, which may short together contacts and lines on the back side of the handler board. According to the present invention, condensation is prevented by not only cooling the devices under test with a gas such as nitrogen or dry air, but also surrounding the handler board 50 with dry gas. To apply dry gas to the back side of handler board 50, the gas flows into a central area 62. As shown in FIG. 12, grooves 68 are cut in the bottom of coplanarity plate 60, preferably in a radial pattern to allow venting of ambient gas as dry gas enters. The dry gas has a dew point of about −100° C., and therefore prevents condensation during testing down to −100° C.

FIGS. 14a–14d show another embodiment of the invention which supports testing of several devices simultaneously.

Figure 14A:
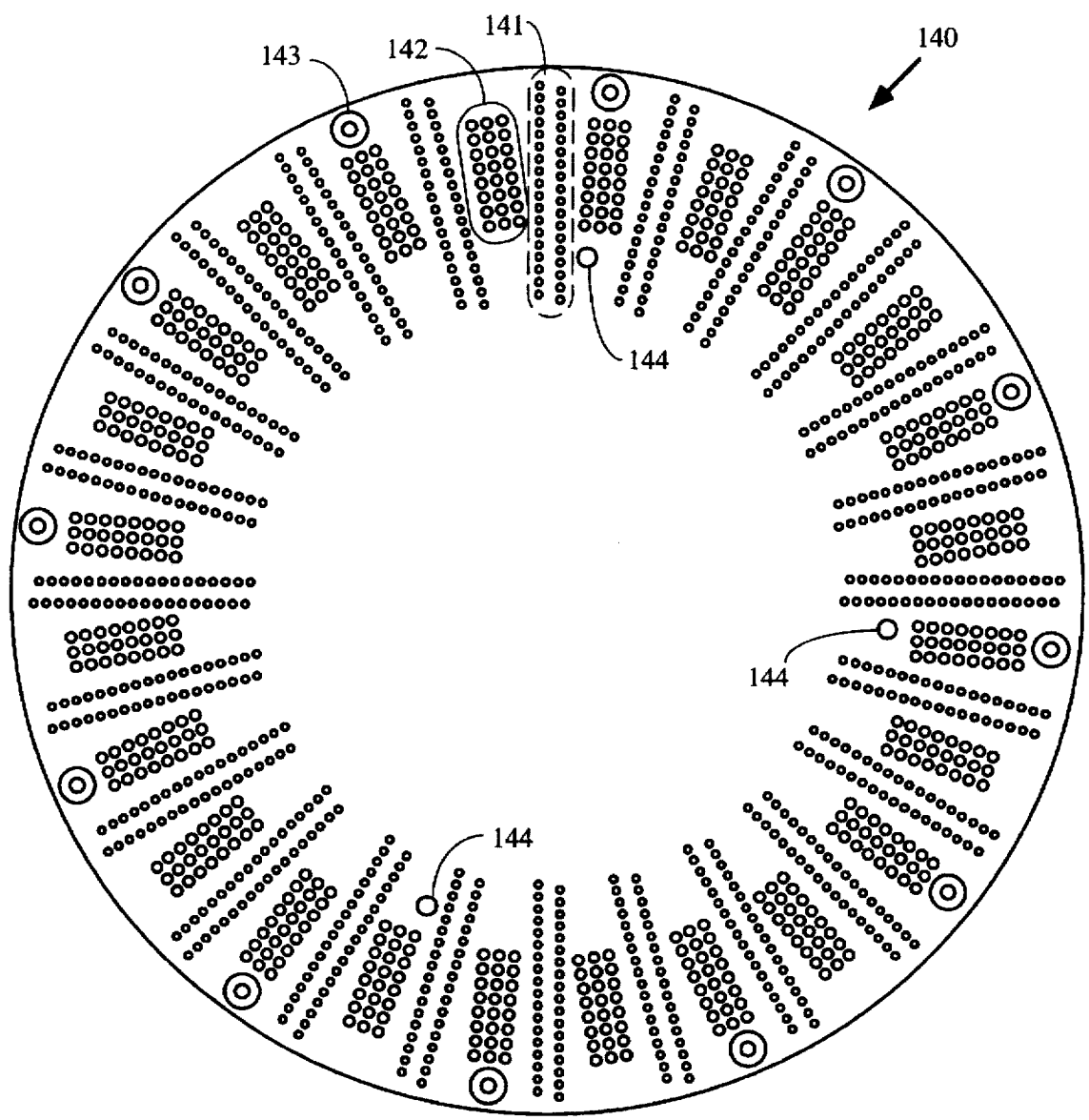
FIG. 14a is a top view of another tester mother board of the invention.

FIG. 14a shows the top surface of a tester mother board 140. Vias are formed into via groups such as 141, which extend to the bottom surface of board 140 and make contact with correspondingly placed contacts in a tester. The configuration shown in FIG. 14a represents the contact placement which must be used with the SC212 tester from Credence Systems Corporation. Pogo pins are arranged in groups such as 142 and extend upward from the top surface of mother board 140. Most pogo pins are connected through metallization not shown to corresponding vias. Some vias and pogo pins may be ganged together for carrying more current or applying the same signal to more than one pogo pin. Reinforced apertures 143 are provided around the perimeter of mother board 140, and close to pogo pin groups 142 for receiving a shoulder bolt from the handler board and compressing pogo pins in groups 142 against contacts in the corresponding handler board. Guide pins 144 (preferably comprising threaded screws inserted at the bottom side of mother board 140 and held in place by sleeves which form the guide pins) are positioned asymmetrically in mother board 140 and extend upward from mother board 140.

Figure 14B:
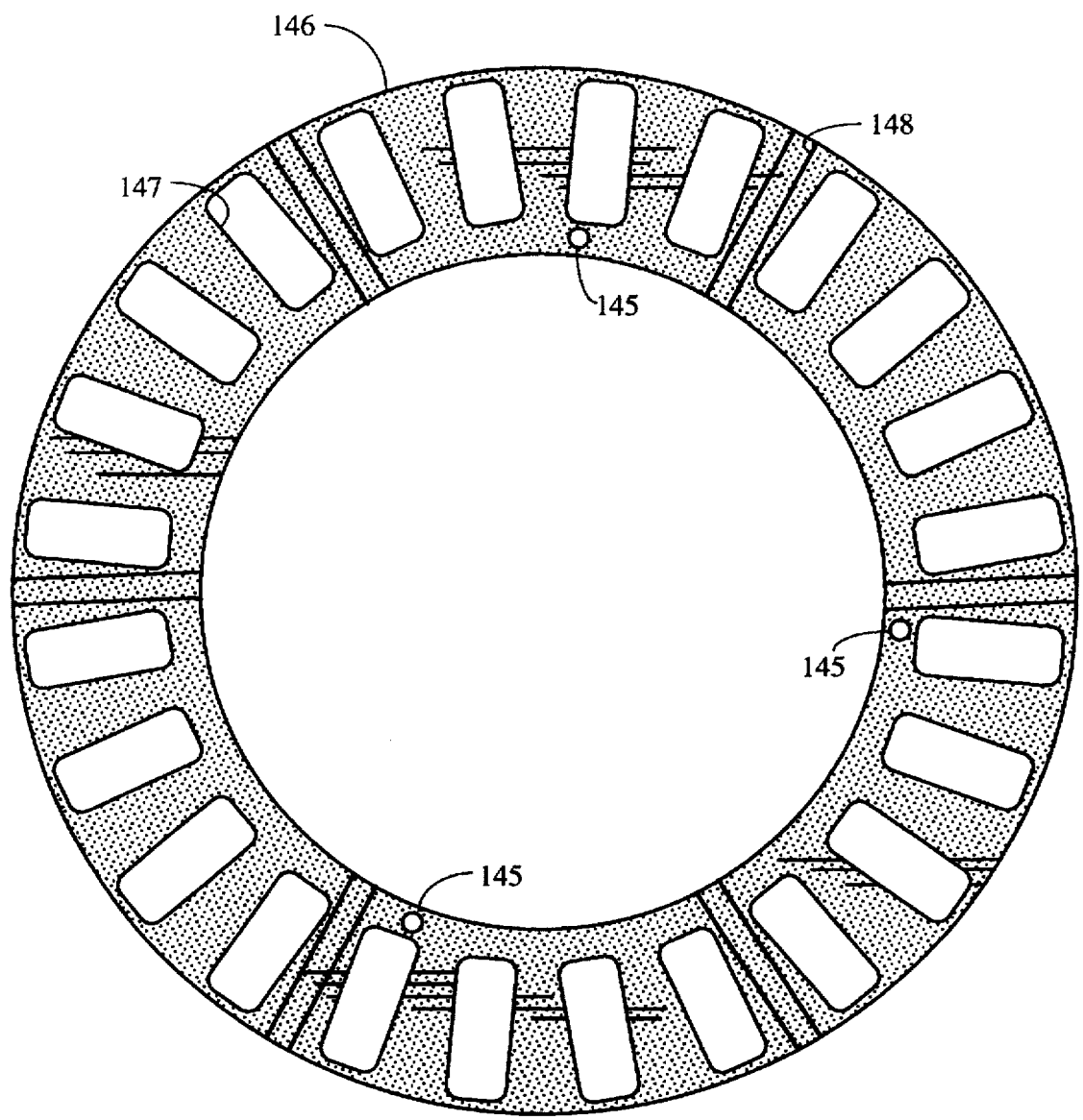

FIG. 14b shows coplanarity ring 146, which is guided into position over mother board 140 by guide apertures 145. Openings 147 receive pogo pin groups 142 (FIG. 14a) and protect the pogo pins from being bent sideways or excessively compressed. In one embodiment, channels 148 allow ambient air to escape as dry gas is forced into the area. In one embodiment, coplanarity ring 146 has a thickness of 13 mm, which is sufficient that a hole in its side can be used for entry of dry gas during low temperature testing. A thickness range of 5 mm to 20 mm is practical.

Figure 14C:
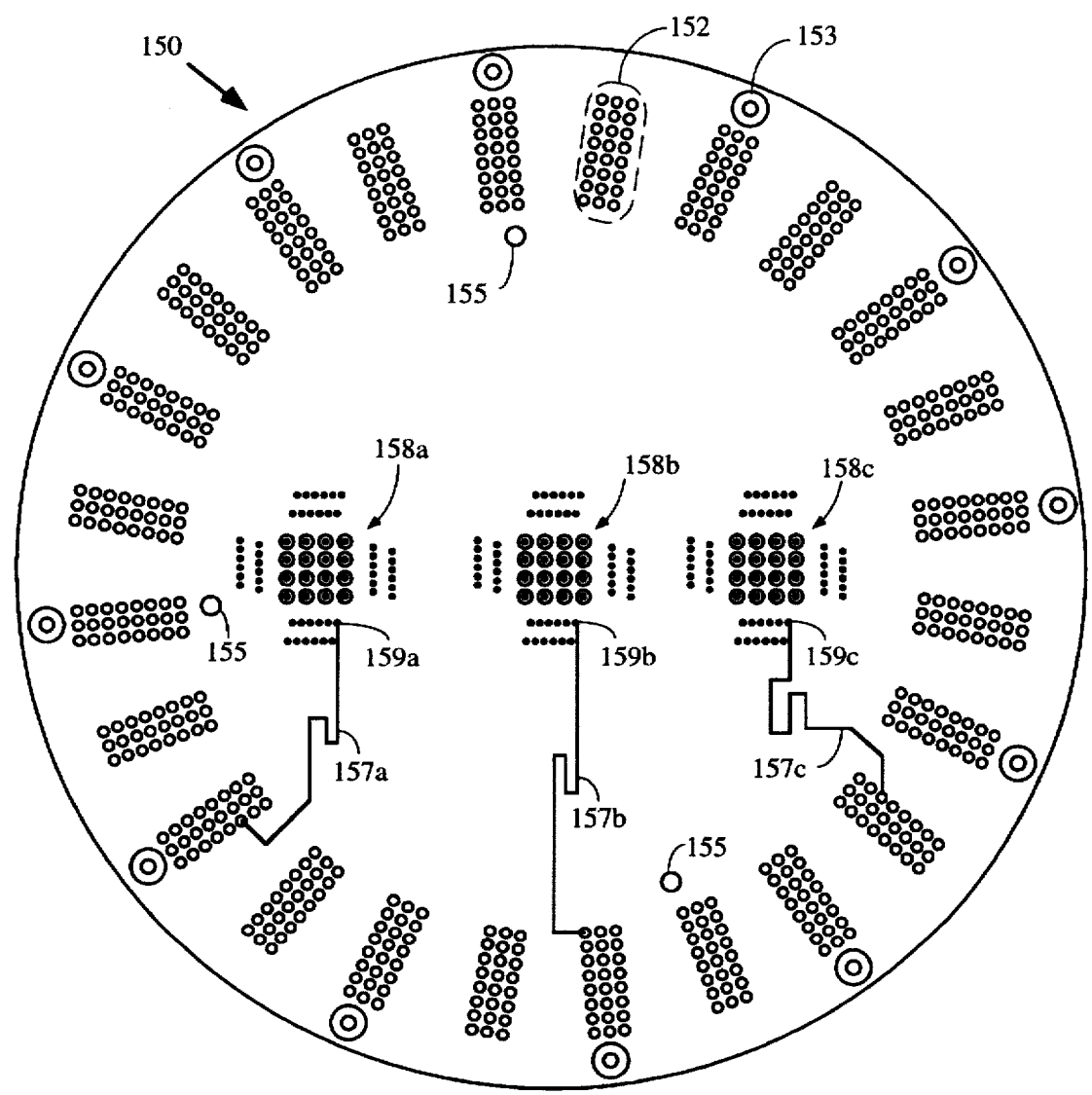
Figure 14D:
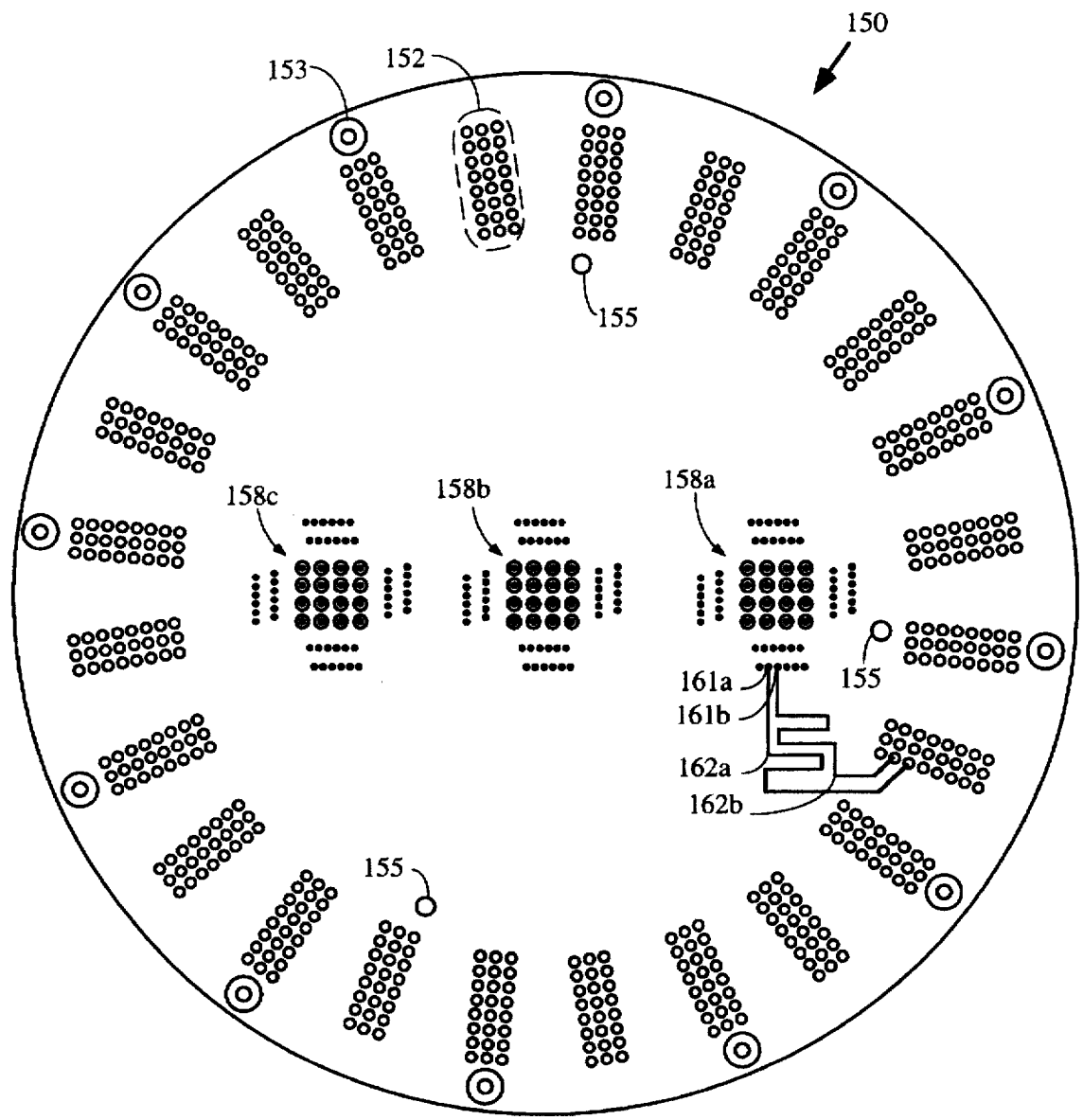
FIG. 14d is a top view thereof.

FIGS. 14c and 14d show respectively bottom and top surfaces of a handler board 150 which can be used with tester mother board 140 of FIG. 14a. Handler board 150 is one of many embodiments which can be used with tester mother board 140. Because of the large central area available for test sites, this handler board can hold three devices at one time for testing. Thus a test floor using such a handler board can have three times the throughput of a test floor which must test only one device at one time. Yet no additional floor space is needed for additional testers and handlers (large structures) and no extra expense is incurred in purchasing more of the expensive testers and handlers.

FIG. 14c shows some of the structures provided on the bottom surface of handler board 150. Contact pads in contact pad groups 152 make contact with corresponding pogo pins on mother board 140. Pads in group 152 contact pogo pins in group 142. Reinforced apertures 153 receive the shoulder bolts from handler board 150. When the shoulder bolts are tightened, contacts 152 press against pogo pins 142. Guide apertures 155 receive guide pins 144 from mother board 140 and assure proper alignment of all pogo pins to corresponding contacts. As with other embodiments, metallization lines from contacts in the test area all have the same delay. Metallization lines 157a, 157b, and 157c are shown and are laid out to produce equal delays. FIG. 14c does not show all metallization lines on the bottom surface of handler board 150.

Figure 15:
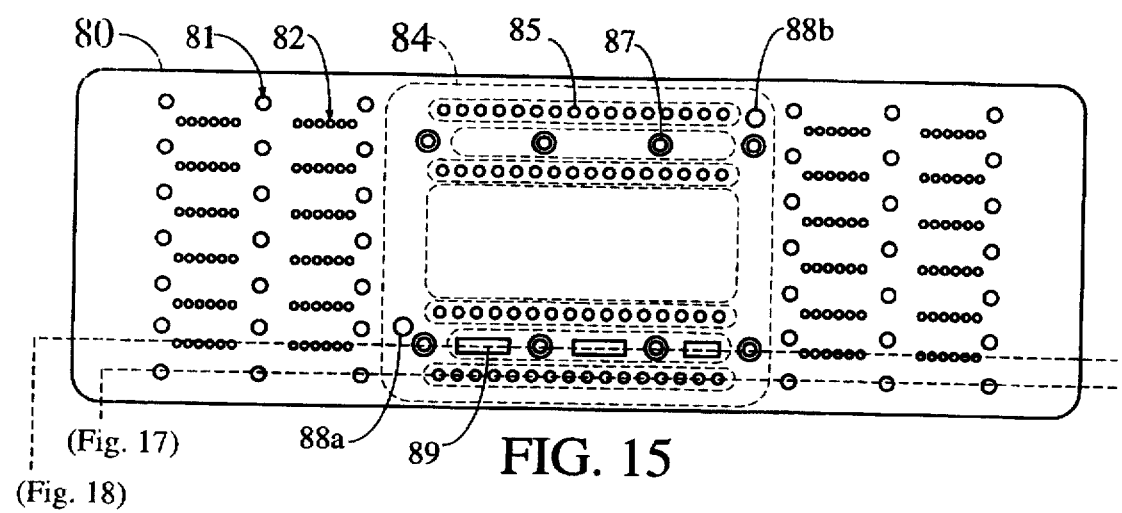
FIG. 15 is a top view of a tester mother board in a linear embodiment of the invention.
Figure 16:
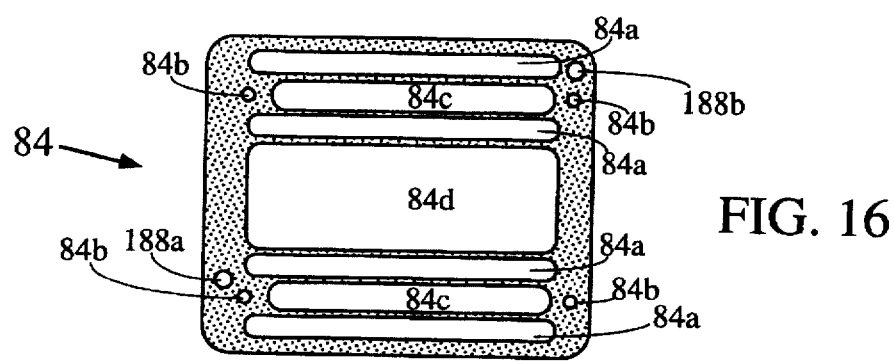
FIG. 16 is a coplanarity plate used with the tester mother board of FIG. 15.
Figure 17:
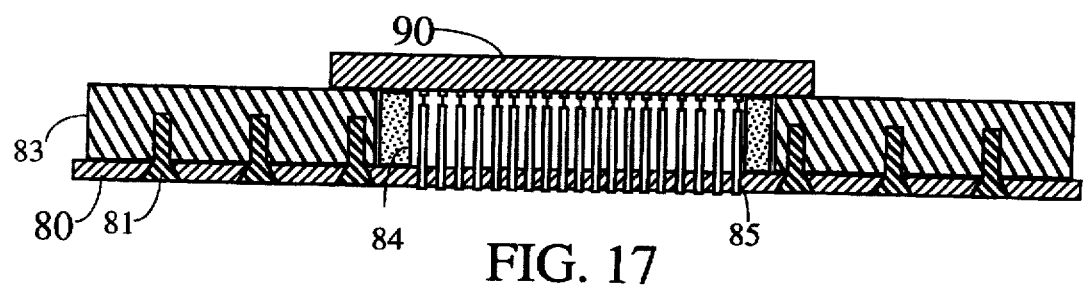
FIGS. 17 and 18 are cross sectional views of an interface structure including the tester mother board of FIG. 15, coplanarity plate of FIG. 16, and a handler board.
Figure 18:
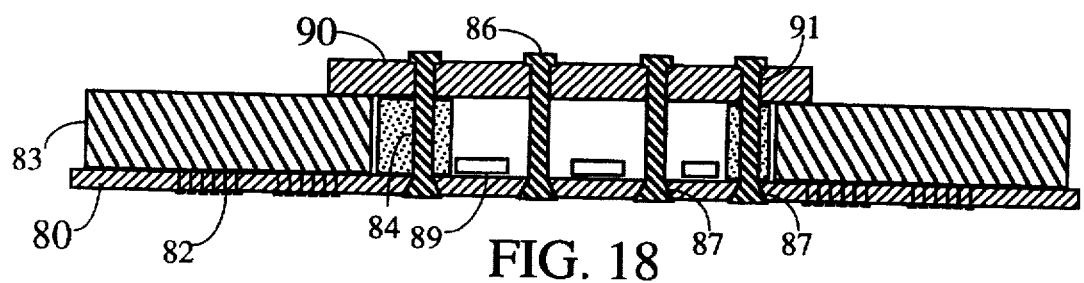

FIGS. 15 through 19b illustrate a linear embodiment of other invention. The mother board is rectangular and the pogo pins are arranged along opposite edges of the mother board. FIG. 15 illustrates a top view of tester mother board 80, and FIG. 16 illustrates coplanarity plate 84. FIGS. 17 and 18 illustrate two cross sections that include tester mother board 80, coplanarity plate 84, and handler board 90. Tester mother board 80 must contact an existing Terradyne Genesis II tester, not shown, through contacts 82 recessed in a rectangular area. Thus, contacts 82 must be positioned to match corresponding contacts in the tester. With this Terradyne tester, tester contacts in a tester mother board must be pressed against the contacts in the Terradyne tester by metal plates 83, which are clamped against the tester. This leaves a small central area through which electrical signals must pass to devices under test.

As shown in FIG. 15, a plurality of tester contacts 82 are provided in the end regions of mother board 80 for cooperating with contacts in the tester. Screws 81 extend upward from mother board 80 for attaching to metal plates 83. In the center portion of FIG. 15, two guide pins 88a and 88b provide alignment with coplanarity plate 84 and handler board 90. Reinforced openings 87 receive bolts 86 (FIG. 18) for applying pressure to pogo pins 85 (FIGS. 15 and 17). For simplicity, metallization lines which connect tester contacts 82 to pogo pins 85 are not shown. However, such connections are of course provided. Preferably the metallization lines are laid out to achieve equal delay, as described above.

According to the invention, coplanarity plate 84 not only achieves coplanarity between the tester mother board 80 and the handler board 90 but also allows for long pins (i.e. 1.5 to 1.75 cm) to be safely used to carry the electrical signals out of the recessed area of the tester up to an unrestricted area above the recess.

Inexpensive handler boards of various designs can then be used for testing different numbers of semiconductor devices and different designs of semiconductor devices. Indeed, a board having a cable leading to a probe card for testing unpackaged wafers can be attached by an appropriate handler board to mother board 80.

FIG. 17 illustrates a cross section through structures near the lower edge of FIG. 15. Included in this cross section are screws 81 for firmly attaching metal plates 83 to mother board 80 and pogo pins 85 for carrying signals from the tester contact to handler board 90. After these screws 81 are attached, the combination of metal plates 83 and mother board 80 is clamped firmly against the tester using a clamping means not shown.

FIG. 18 illustrates a cross section through contacts 82, reinforced openings 87 which receive bolts 86, and integrated circuit devices 89, all of which are illustrated in FIG. 15. FIG. 18 also illustrated reinforced openings 91 in handler board 90 for receiving bolts 86.

Coplanarity plate 84, illustrated in top view in FIG. 16 (and suggested by dashed lines in FIG. 15) fits into the central space not occupied by metal plates 83, and includes several openings. Openings 84a accommodate pogo pins 85. Openings 84b accommodate some of bolts 87. Other openings 84c accommodate other bolts 87 and also small integrated circuit devices 89 which modify the test signals. Opening 84d accommodates other integrated circuit devices for modifying test signals and provides a cavity for flowing dry gas against the bottom surface of handler board 90. Coplanarity plate 84 is guided into position against mother board 80 by guide pins 88a and 88b on mother board 80, which fit into apertures 188a and 188b, respectively, in coplanarity plate 84. As in other embodiments, the guide pins and openings are positioned asymmetrically so the coplanarity plate and handler board can be fitted against mother board 80 in only one orientation. The relationship between openings in coplanarity plate 84 and structures related to mother board 80 can be seen by inspecting the dashed line representation of coplanarity plate 84 shown in FIG. 15.

As discussed above, pumping dry gas into a cavity 84d adjacent handler board 90 prevents condensation during cold temperature testing. Also, during high temperature testing of semiconductor devices inserted into handler board 90, dry or ambient gas may be pumped into cavity 84d to prevent excess heating of mother board 80 and integrated circuit components 89.

When bolts 86 are tightened into position against openings 87 and 91, pogo pins 85 are compressed against contacts on the bottom surface of handler board 90 to make good electrical contact.

Figure 19A:
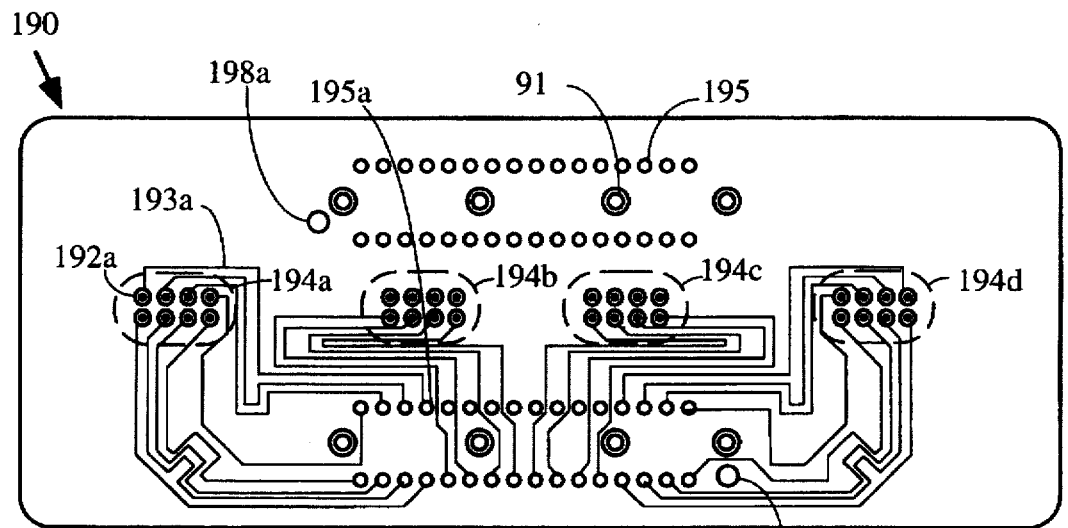
FIGS. 19a and 19b are bottom and top views respectively of a handler board usable with the tester mother board of FIG. 15.
Figure 19B:
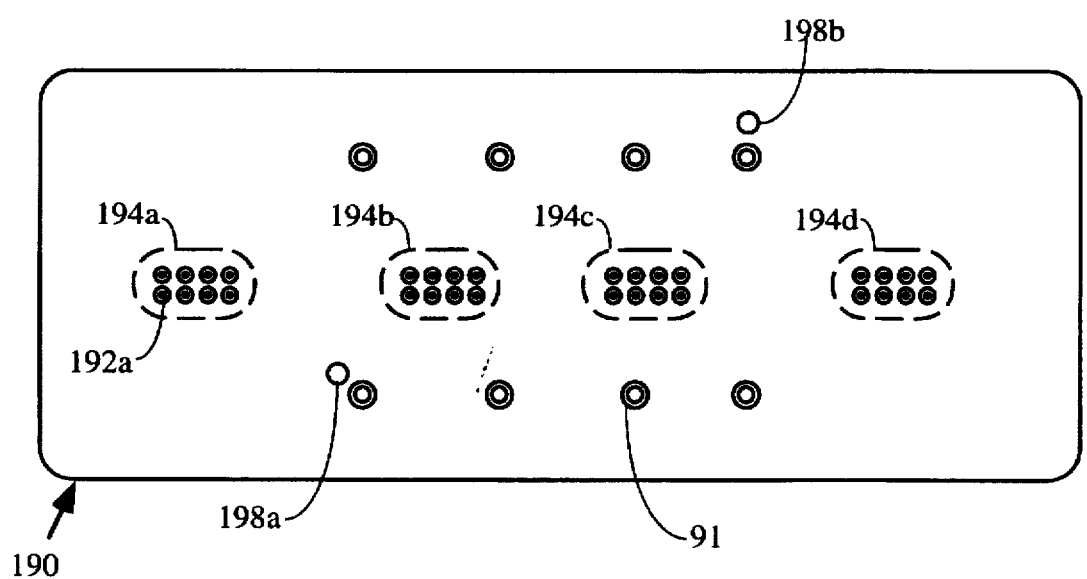

FIGS. 19a and 19b show bottom and top surfaces respectively of handler board 190, which is one embodiment of handler board 90 shown in FIGS. 17 and 18. Contacts 195 which make contact with pogo pins 85 of FIG. 15 are shown in FIG. 19a. Metallization lines connect contacts 195 to respective pins in test sites 194a through 194d. For example, FIG. 19a shows that metallization line 193a connects contact 195a to pin 192a in test site 194a. The embodiment shown in FIGS. 19a and 19b accommodates four semiconductor devices at test sites 194a through 194d for simultaneous testing, and uses half of the contacts 195 in the lower two rows. Some metallization lines in FIG. 19a are not shown because they are located in a metallization layer interior to board 190.

Another embodiment of handler board 90 accommodates eight semiconductor devices each having eight pins, and uses all of contacts 195. Yet another handler board accommodates a single semiconductor device having 64 pins. Clearly many handler boards can be combined with mother board 80 of FIG. 15. Contacts 195 must align with pogo pins 85, guide openings 198a and 198b must align with guide pins 88a and 88b, and reinforced openings 91 must align with reinforced openings 87 for receiving bolts 86. Dimensions of handler board 90 may vary and metallization lines and test sites may vary. The cost of providing many different handler boards for use with a tester such as the Terradyne tester is considerably less than the cost of providing many mother boards such as mother board 80. And the freedom to vary dimensions in handler board 90 allows one tester such as the Terradyne tester to be used for many more purposes.

The above description of embodiments of this invention is intended to be illustrative and not limiting. Other embodiments of this invention will be obvious to those skilled in the art in view of the above disclosure.

I claim:

1. A semiconductor device tester and handler interface comprising a tester mother board and a handler board;
   said tester mother board comprising:
      a grouping of tester contacts positioned on the bottom side of said tester mother board so as to contact a tester, and surrounding a central area of said tester mother board;
      a plurality of handler contact pins extending upward from the top side of said tester mother board and positioned farther from said central area of said tester mother board than said grouping of tester contacts;
      a plurality of tester metallization lines, each metallization line connecting one of said tester contacts to one of said handler contact pins;
   said handler board comprising:
      a plurality of handler bottom side contacts each positioned to contact one of said handler contact pins in said tester mother board;
      a work area defined by said handler contact pins including at least one test site for receiving a corresponding at least one semiconductor device, said work area being larger than said central area; and
      a plurality of handler metallization lines, each handler metallization line connecting one of said handler bottom side contacts to a contact in said test site.

2. The interface of claim 1 wherein said grouping of tester contacts comprises a first grouping and further comprising a second grouping of tester contacts, wherein said first and second groupings of tester contacts are arranged as first and second concentric rings, and said handler contact pins are arranged in a ring between said first and second groupings of tester contacts.

3. The interface of claim 2 wherein said handler contact pins are spring-biased pogo pins,
   said interface further including an annular non-electrically conductive coplanarity plate extending parallel to and between said tester mother board and said handler board, said coplanarity plate having an inner periphery bounding said central area of said tester mother board and an outer periphery adjacent to said pogo pins such that compression of said pogo pins is equalized without overstressing said pogo pins.

4. The interface of claim 3 wherein said plate is a plastic plate having a thickness about 5 mm to about 20 mm.

5. The interface of claim 4 wherein said plate includes surface grooves extending from the inner periphery of the plate to the outer periphery of the plate for venting of gas from the interface.

6. The interface of claim 5 wherein said tester mother board, said handler board and said plate are circular.

7. The interface of claim 6 wherein said grooves are radial grooves.

8. The interface of claim 3 further including a series of guide pins extending from said tester mother board between said first and second rings of tester contacts, said plate and said handler board having apertures alignable with respective ones of said guide pins upon assembly of said boards.

9. The interface of claim 8 wherein said guide pins have a distal end shaped to guide said plate and said handler board onto said tester mother board.

10. The interface of claim 2 wherein said handler board and said tester mother board are circular and said first and second rings of tester contacts and said ring of handler contact pins extend circumferentially around said tester mother board.

11. The interface of claim 2 wherein one of said rings of tester contacts carries test signals and the other of said rings of tester contacts carries utility signals.

12. The interface of claim 11 wherein said tester utilities include a tester power supply, a relay control, an external relay power supply, a ground voltage supply, and a board status register.

13. The interface of claim 1 wherein said work area is larger than 25% of a total area of said tester mother board.

* * * * *